United States Patent [19]

Janisiewicz et al.

[11] 4,253,585
[45] Mar. 3, 1981

[54] DIP COMPONENT SUPPLY MAGAZINE

[75] Inventors: Stanley Janisiewicz, Endwell; Robert H. Holmes, Binghamton, both of N.Y.

[73] Assignee: Universal Instruments Corporation, Binghamton, N.Y.

[21] Appl. No.: 78,683

[22] Filed: Sep. 25, 1979

[51] Int. Cl.³ ............................................. B65H 31/20
[52] U.S. Cl. ..................................................... 221/242
[58] Field of Search ................. 29/741; 221/298, 242, 221/312 R, 312 A, 279

[56] References Cited

U.S. PATENT DOCUMENTS

| 3,145,066 | 7/1962 | O'Neal | 221/242 X |
| 4,063,347 | 12/1977 | Woodman, Jr. | 29/741 X |

Primary Examiner—Stanley H. Tollberg
Attorney, Agent, or Firm—Fidelman, Wolffe & Waldron

[57] ABSTRACT

Two or four lead DIP components are stored in a generally vertical, adjustable chute for gravity feed during lateral removal of a single component by a coacting shuttle tooling clamp arm from the bottom of the supply. Individual component removal is facilitated by a spring biased plunger for blocking removal of the bottom-most component until the coacting clamp arm raises the plunger against the action of the spring biasing.

8 Claims, 9 Drawing Figures

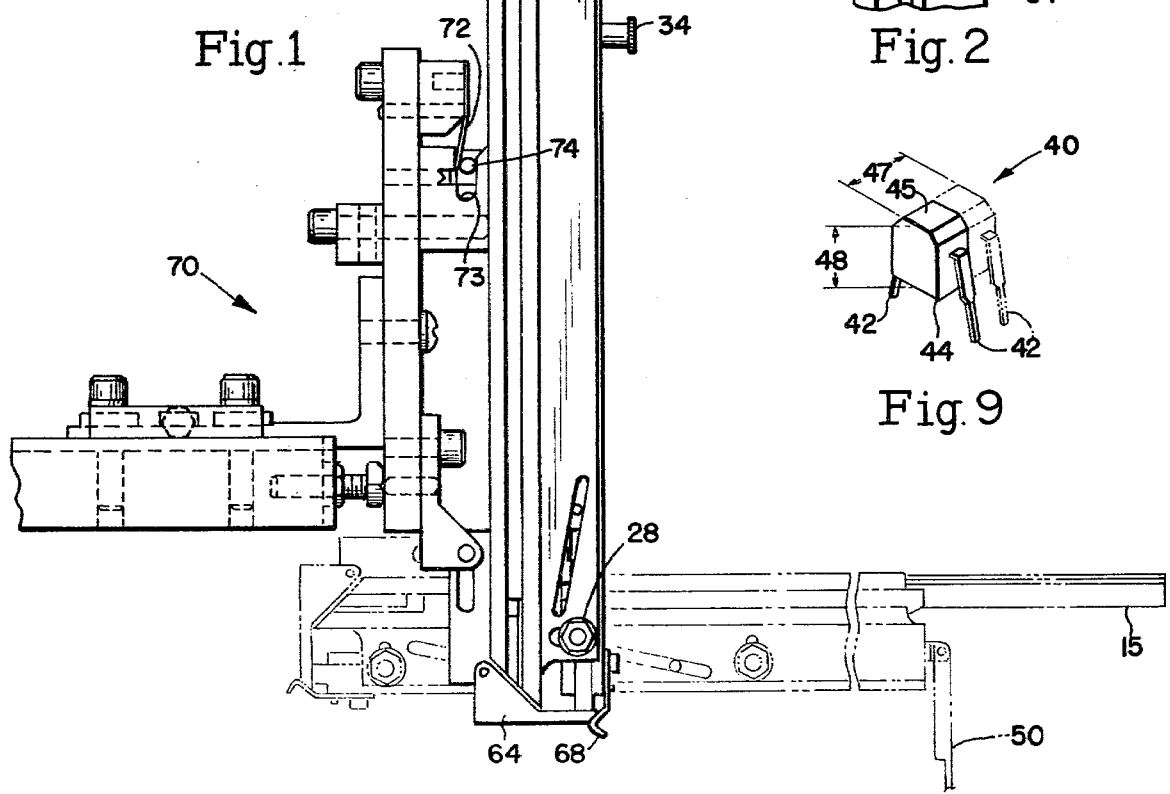

DIP COMPONENT SUPPLY MAGAZINE

CROSS-REFERENCES TO RELATED APPLICATIONS

1. Ser. No. 860,728, DIP Storage and Dispensing Magazine, to Zemek, et al. 2. application Ser. No. 078,682, Multi-Module Dip Transfer and Insertion Machine, to Janisiewicz, et al. (copending).

BRIEF SUMMARY OF THE INVENTION

This invention relates generally to a gravity feed storage magazine which dispenses items from storage singly. More particularly, the device is for dispensing electronic components of the type generally referred to as a dual inline package (DIP).

The use of integrated circuit boards in electronic equipment of all types is burgeoning because of the development of standardized circuit components and the adaptation of machinery for economically and automatically assembling components onto circuit boards. For efficient operation of such machines it is necessary that components, generally in an assortment of electrical and physical sizes and types, be stored in the machine itself and be readily available for instant withdrawal from storage when needed. Additionally, proper component storage and dispensing protects the components from damage that frequently occurs when components are randomly stored.

The magazines of this invention may be used in fully automated assembly machines, often computer controlled. Removal of a component from the storage magazine in such a machine is but one in a series of automated steps by which the component is operated on until it is finally mounted on the circuit board.

Standardized component modules packaged with two rows of parallel lead prongs [i.e. a duel in-line package (DIP)], extending from a rectangular body, are now extremely common in the industry. The leads extend from both sides of the body and bend at the right angles to the body, one side generally being a mirrow image of the other side. Most components have 14 or 16 leads but there can be more or less. The instant invention is designed for 2 or 4 lead components but could be adapted to be used for other size components. These leads are pressed into multi-receptacle sockets mounted to the circuit board or are inserted through holes in the circuit boards.

There is a need in the industry for a simple, trouble free, easily loadable storage magazine for removal of single DIP components of the 2 and 4 lead type at a preferred orientation for cooperation with the shuttle tooling assembly of the copending application.

SUMMARY OF THE INVENTION

The storage magazine of this invention includes a generally enclosed vertical chute which, when filled contains DIP components stacked one atop the other in an end-to-end arrangement. The rows of lead prongs straddle a central guide rail within the chute such that all components maintain the same orientation. The lower or discharge end of the chute is blocked by a slotted, pivotal retainer which prevents the bottom release of a component. When the retainer, which is held in position by a spring clip, is pivoted away from the chute opening, gravity causes all of the components to fall freely from the chute to facilitate changing the supply to a different type of DIP. A plunger located adjacent to the bottom of the vertical chute is sping biased down to block lateral release of the bottom-most component until a coacting shuttle tooling is pivoted upward through the slotted retainer to raise the plunger. The shuttle tooling clamps a component and retracts while in the horizontal position, for lateral removal of the DIP from the storage magazine. This plunger is interchangeable for two and four lead components.

DIPs having different body thicknesses are accomodated by an easy adjustment of the chute. The DIPs are shipped from the vendor in well-known plastic or metal tubes (sticks) of a generally standard size. These standard size sticks are used to contain DIPs of non-standard body thicknesses for shipment. For instance, the thickness of the body of the DIPs may vary from 0.125 to 0.150 (or greater) inches. Usually, pins are placed near to (typically about one-half inch from) the ends of the sticks to hold the DIPs abutted end-to-end such that there is little or no sliding of the DIPs in the sticks during shipment, and at least one of these pins must be removed to slide the DIPs out of the stick. With DIPs of small body thicknesses, even if the adjustment of the chute is perfect, the DIPs have the distance from the pin location to the bottom of the stick within which to slightly tumble or rotate when loading is attempted with the magazine in the vertical position. This tumbling sometimes causes the leads of one component to become engaged with the leads of an adjacent component, resulting in jamming or misorientation of the components in the magazine. To prevent this problem, the magazine is pivotal to the horizontal position and a hinged, padded clamp (adapted to clamp the stick in proper position at the open end of the magazine) is opened. With the magazine in the horizontal position and the stick abutting the open end of the chute and oriented such that the DIP leads are extending upwardly, the clamp is closed and a rod-like tool is inserted into the end of the stick away from the chute. This tool is used to push the DIPs from the stick into engagement with any DIPs remaining in the magazine. If no DIPs are already in the magazine, then the chute is adjusted for the first DIP to prevent subsequent DIPs from riding-up on each other. After this loading procedure, and with the DIPs fully pushed into the magazine, the magazine is pivoted back to the vertical position and retained there by a spring latch arrangement.

With the storage magazine loaded and in the vertical position, the leads of the components straddle a guide rail and a preferred top-end/bottom-end orientation of the components is maintained for removal at the discharge end of the chute.

A magazine of this type is suited, for example, to an apparatus for selecting and inserting dual in-line components as disclosed in the copending application.

Accordingly, it is an object of this invention to provide a storage magazine to supply and feed DIP components for individual removal from storage.

Additionally, it is an object of this invention to provide a storage magazine adapted to cooperate with a shuttle clamp arm for easy removal of DIP components singly from storage.

It is a further object of this invention to provide a magazine for removal of DIP components with a preferred orientation.

Still another object of this invention is to provide a magazine which can be loaded with additional components without misorientation of the components.

Yet another object of this invention is to provide a magazine which is readily adjustable to components of various body thicknesses.

Other objects, advantages and novel features of the present invention will become apparent from the following detailed description of the invention when considered in conjunction with the accompanying drawings in which:

FIG. 1 is a left-side elevation of the magazine and support, the phanton lines showing the magazine in the horizontal loading position.

FIG. 2 is a partial side elevation of FIG. 1, depicting the adjusting movement of the chute.

FIG. 7 is a bottom view of the pivotal retainer.

FIG. 8 is a perspective view of the extended shuttle tooling assembly clamp adapted for cooperation with the magazine.

FIG. 9 is a perspective view of a DIP used with the magazine.

Figure 4:
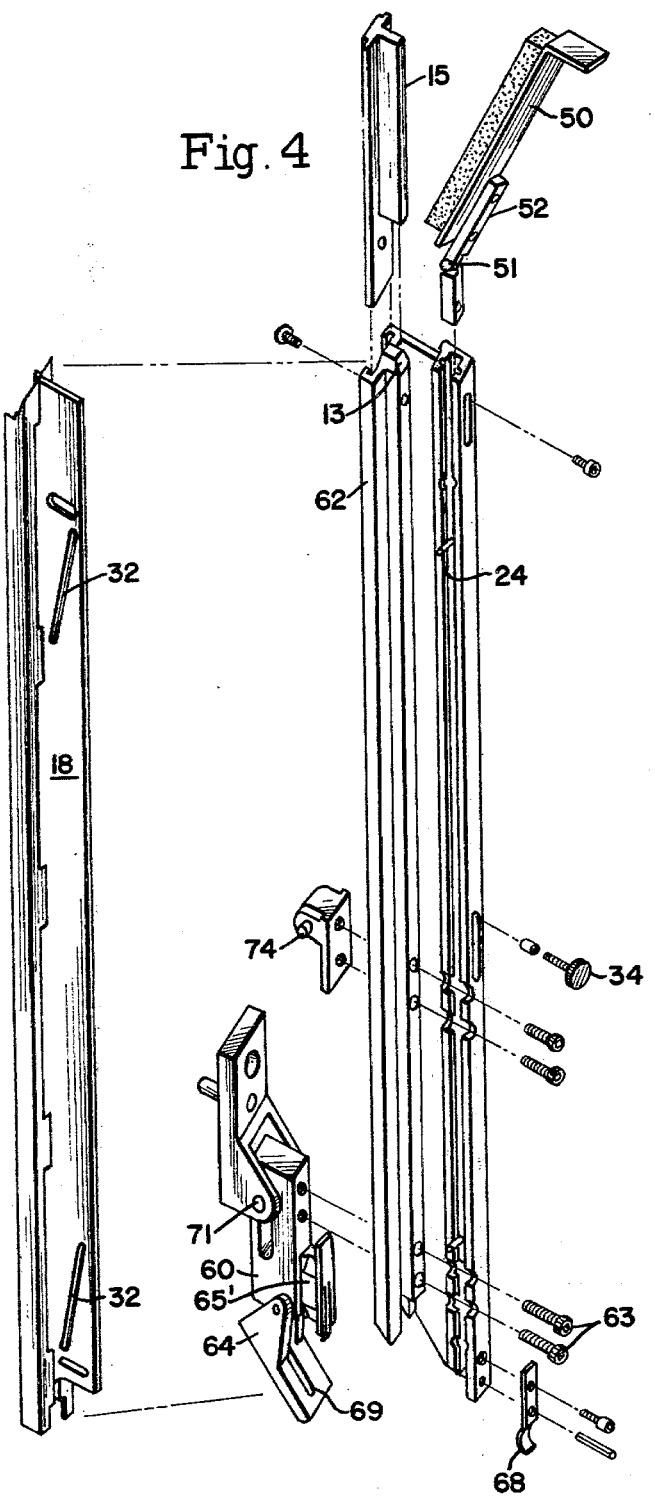
FIG. 4 is an exploded view of the magazine.

With reference to the Figures, the storage and supply magazine 10 of this invention is comprised of an elongated guide rail 12 spaced apart from an opposing adjustable shallow channel 14. The flanges 16 of the channel 14 extend toward the guide rail 12 and a mounting strip 18 extends from the back of the channel 14 away from the guide rail 12. A web 20 joins the base of the guide rail 12 to a slide support 22 having an adjusting slide 24.

Channel 14 is mounted for adjustment in the directions of arrow 26 by means of a nut and bolt arrangement at 28. The movement of channel 14 is controlled by slide 24 having pins 30 in sliding engagement with slots 32 of Channel 14. These slots 32 are canted relative to the longitudinal axis of channel 14, as shown, such that reciprocation of slide 24 within slide support 22 causes pins 30 to bear against the slides of slots 32 thereby causing channel 14 to move as indicated by arrow 26. Screw 34 is for locking slide 24 in a selected position, thus forming an elongate chute 36 between guide rail 12 and channel 14. Dip components 40 (FIG. 9) are stored end-to-end in this chute 36 with their two rows of lead prongs 42 astraddle the guide rail 12, with underside 44 of the DIP body riding against guide rail12, and with upper surface 45 nesting with a sliding fit between the flanges 16 of the channel 14.

Accordingly, a DIP component 40 placed with lead prongs 42 astride the guide rail 12 is free to slide the length of the magazine 10. At the upper end of the magazine 10, the central guide rail 12 has a reduced lead-in portion 13 and a lead-in rail 15 of narrower width than guide rail 12, to facilitate loading components 40 into the chute 36 of the magazine 10 from the upper end. The magazine chute 36 with guide rail 12 and channel 14, as described above, has been satisfactorily produced by fastening together several extruded elements. The reduced lead-in portion 13 tapers symetrically toward guide rail 12, thereby furtherfacilitating smooth sliding of components 40 through the chute 36 as discussed hereinafter.

A padded clamp 50 is attached to a support post 52 which is hinged at 51. Hinged post 52 is slidably retained in the upper end of slide support 2, such that lifting clamp 50 will clear hinge 51 out of and above the upper end of support 22, thereby allowing clamp 50 to pivot away from lead-in rail 15.

At the lower end of magazine 10, a generally rectangular block 60 attaches to guide rail support 62 by means of allen bolts 63. A retaining plate 64 is pivotally supported at 65 and is held in the 'up' position by a spring clip 68.

Block 60 is slotted at 61 for sliding engagement with rod 71 of support bracket 70. A spring clip 72 and notch 73 of bracket 70 form a latch means for pin 74 of guide rail support 62. The support 62 may be grasped while in the vertical position of FIG. 1 and lifted to disengage pin 74 from the latch and to slide block 60 upward relative to bracket 70. In this manner, the magazine is freed for rotation to the horizontal loading position shown in phantom lines in FIG. 1.

Loading is accomplished with the chute in the loading position and clamp 50 opened as described above. A "stick" of components is then clamped in place on lead-in rail 15, and chute 36 is adjusted by loosening screw 34 and moving slide 24 to accommodate the component thickness 48. Screw 34 is then tightened to lock the adjusted spacing of the chute 36. A rod-like tool is inserted into the unclamped end of the 'stick' to force the components into the chute 36 and into abutment with pivotal retainer 64. The magazine 10 may then be rotated to the vertical position, and latched for component removal.

Block 60 also has a lateral extension within which a plunger 66 is slidable. Plunger 66 is biased to a closed position (down) by spring 67. With retainer 64 held in the up position by spring clip 68 the bottom-most DIP, cleared from the bottom of chute 36, is prevented from dropping out of the magazine 10, and lateral removal of DIP 40 from magazine 10 is blocked by plunger 66.

A clamp arm 100, as in the copending application, is adapted to be extended and pivoted up through a slot 69 in retainer 64 into engagement with the upper surface 45 of DIP 40. Pivoting clamp arm 100 up through slot 69 also engages and raises plunger 66 against the bias of spring 67. Clamp arm 100 may then be retracted, thus pulling the DIP 40 laterally away from the magazine 10 past plunger 66 and clamping DIP 40. Plunger 66 is then free to return to the closed position, thus blocking removal of the next DIP 40. In this manner, components are individually removed, as needed. The remaining components 40 in chute 36 slide down to rest atop the next lower component and the operational procedure may be repeated.

Figure 5:
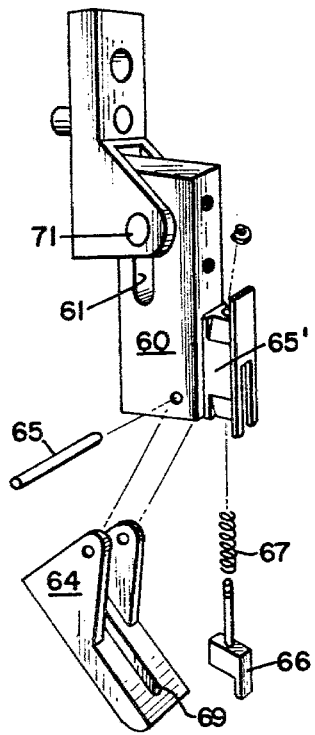
FIG. 5 is an exploded view of the discharge mechanism.
Figure 6:
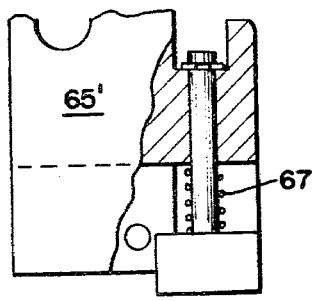
FIG. 6 is a side elevation of a two-lead plunger, partially in section.
Figure 3:
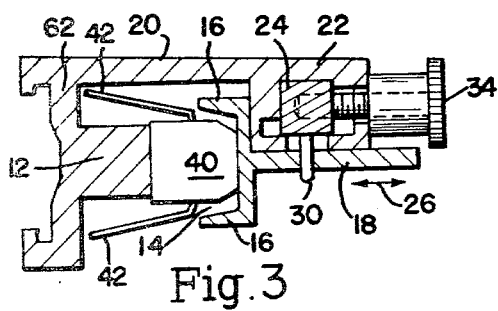
FIG. 3 is a cross-sectional view along-lines 3—3 of FIG. 2.

The plunger 66 of FIG. 5 is adapted for 2 lead DIPs, and may be interchanged with the plunger of FIG. 6 for 4 lead DIPs. Of course, the same principle could be used for other sizes of components.

From the preceding description, it is evident that the objects of the invention are attained and, although the invention has been described and illustrated in detail, it is to be clearly understood that the description is by way of illustration and example only and is not to be taken by way of limitation, the spirit and scope of this invention being limited only by the terms of the appended claims.

We claim:

1. In a magazine for vertical, end-to-end storage and lateral supply of a plurality of DIP components, said magazine having an elongate guide rail parallel and opposed to and spaced apart from an elongate channel to form a chute therebetween, said chute having a loading end and a discharge end and said guide rail being contoured to be straddled with a sliding fit by opposed pairs of prongs of said DIP components, the improvement comprising:

an adjustment means for varying the chute spacing between said guide rail and said elongated channel to accommodate components of different body thicknesses;

a reduced lead-in portion at said loading end of said guide rail;

a lead-in rail linear with said guide rail and abutting said lead-in portion; and a padded clamp means for clamping a component supply stick to said lead-in rail.

2. An apparatus as in claim 1, wherein said adjustment means comprises:

a guide rail support, a slide support attached to said guide rail support by a web and having a reciprocable slide therein, said slide support having an upper end and a lower end, said channel having a slot means canted relative to the length of said channel for sliding engagement with a pin means attached to said slide for rectilinear movement of said channel toward and away from said guide rail.

3. An apparatus as in claim 2, wherein said slide support further comprises:

a locking means for locking said slide relative to said slide support.

4. An apparatus as in claim 1, wherein said padded clamp means comprises:

a hinged support post for said padded clamp slideably retained in said upper end of said slide support, whereby raising said support post frees the hinge and allows the padded clamp to be pivoted away from said lead-in rail, and lowering said support post when said padded clamp is generally parallel to said lead-in rail locks the hinge and abuts said padded clamp against the upper end of said slide support to lock said padded clamp parallel to said lead-in rail.

5. an apparatus as in claim 1, wherein said magazine further comprises:

a support bracket having a latch means for latching and supporting said guide rail support in the vertical position;

a support rod means for pivotally supporting said guide rail support; and said guide rail support including a slotted block slideably engaging said support rod, whereby lifting said guide rail support when in the vertical position allows disengagement of said latch means and upward sliding of said guide rail support slot relative to said support rod, such that said guide rail support may be unlatched and pivoted away from said bracket to a horizontal position.

6. An apparatus as in claim 5, wherein said slotted block comprises:

a pivotal retainer means engageable with a spring clip at said discharge end of said chute for a bottom-most component of the supply to rest on; and a plunger having an open position and a closed position and adapted to block lateral displacement of said bottom-most component relative to the longitudinal axis of said chute when in said closed position and to allow lateral displacement of said component when in said open position.

7. An apparatus as in claim 6, wherein: said plunger is spring biased to said closed position;

said pivotal retainer means is slotted; and said plunger is adapted to be forced to said open position by a separate component clamp arm which moves through said slotted retainer means to engage said bottom-most component and move it laterally relative to said longitudinal axis of said chute and out of said magazine.

8. An apparatus as in claim 6, wherein:

said plunger is interchangeable for components of different body length.

* * * * *